US009406854B2

(12) United States Patent
Margalit et al.

(10) Patent No.: US 9,406,854 B2
(45) Date of Patent: Aug. 2, 2016

(54) WAFER LEVEL PACKAGING OF ELECTRONIC DEVICES

(76) Inventors: Mordehai Margalit, Zichron Yaaqov (IL); Israel Petronius, Haifa (IL)

( * ) Notice: Subject to any disclaimer, the term of this patent is extended or adjusted under 35 U.S.C. 154(b) by 10 days.

(21) Appl. No.: 13/424,875

(22) Filed: Mar. 20, 2012

(65) Prior Publication Data
US 2012/0261697 A1 Oct. 18, 2012

Related U.S. Application Data

(63) Continuation-in-part of application No. PCT/IL2010/000772, filed on Sep. 20, 2010.

(60) Provisional application No. 61/351,875, filed on Jun. 5, 2010, provisional application No. 61/244,046, filed on Sep. 20, 2009.

(51) Int. Cl.
*H01L 21/768* (2006.01)
*H01L 33/62* (2010.01)
*H01L 23/48* (2006.01)
*H01L 33/38* (2010.01)
*H01L 33/48* (2010.01)

(52) U.S. Cl.
CPC .......... *H01L 33/62* (2013.01); *H01L 21/76898* (2013.01); *H01L 23/481* (2013.01); *H01L 33/382* (2013.01); *H01L 33/486* (2013.01); *H01L 2224/02372* (2013.01); *H01L 2224/0401* (2013.01); *H01L 2224/05548* (2013.01); *H01L 2224/131* (2013.01); *H01L 2224/13024* (2013.01); *H01L 2924/1461* (2013.01); *H01L 2933/0066* (2013.01)

(58) Field of Classification Search
None
See application file for complete search history.

(56) References Cited

U.S. PATENT DOCUMENTS

| 6,365,429 | B1 * | 4/2002 | Kneissl ................. B82Y 20/00 257/E21.122 |
| 6,856,023 | B2 * | 2/2005 | Muta et al. ..................... 257/774 |
| 7,232,754 | B2 * | 6/2007 | Kirby et al. .................... 438/667 |
| 7,951,625 | B2 * | 5/2011 | Kamei ............................. 438/27 |
| 8,278,213 | B2 * | 10/2012 | Kameyama et al. .......... 438/667 |
| 2005/0151228 | A1 * | 7/2005 | Tanida ............. H01L 21/76843 257/620 |
| 2009/0108283 | A1 * | 4/2009 | Kadotani et al. ................ 257/98 |
| 2011/0175236 | A1 * | 7/2011 | Lou .................... H01L 21/76898 257/774 |
| 2011/0201197 | A1 * | 8/2011 | Nilsson ............. H01L 21/30604 438/638 |
| 2011/0241074 | A1 * | 10/2011 | Okamoto .......... H01L 21/76898 257/194 |
| 2011/0272806 | A1 * | 11/2011 | Akram .............. H01L 21/76898 257/738 |
| 2012/0018742 | A1 * | 1/2012 | Nishi ................ H01L 21/76898 257/77 |
| 2012/0021598 | A1 * | 1/2012 | Kawakubo ........ H01L 21/30621 438/612 |
| 2012/0181698 | A1 * | 7/2012 | Xie .................. H01L 21/76898 257/770 |
| 2013/0015504 | A1 * | 1/2013 | Kuo ........................ H01L 21/84 257/213 |

* cited by examiner

*Primary Examiner* — David Zarneke
(74) *Attorney, Agent, or Firm* — Intrinsic Law Corp.; Ibrahim M. Hallaj

(57) ABSTRACT

Aspects of the invention include an electronic device comprising a first contact point; a metal pad disposed to provide electrical connection to the first contact point; a substrate comprising a first face and a second face opposing the first face of the substrate, the first face of the substrate adjacent a face of the electronic device; and a VIA passing through the substrate from the second face of the substrate to the metal pad, the VIA exhibiting: a pass through extending through the substrate from the first face to the second face; a metal layer disposed within the pass through arranged to provide electrical connectivity to the metal pad from an area adjacent the second face of the substrate; and an electrically insulating first passivation layer disposed between the metal layer and the substrate arranged to provide electrical insulation between the substrate and the metal layer.

15 Claims, 25 Drawing Sheets

WAFER LEVEL PACKAGING OF ELECTRONIC DEVICES

TECHNICAL FIELD

The invention relates generally to the field of wafer level packaging for 5 electronic devices, and in particular wafer level packaging wherein a VIA is produced through a substrate, the VIA arranged to provide an insulated connection path to the electronic device through the substrate.

RELATED APPLICATIONS

Pursuant to 35 U.S.C. 371, PCT Article 8 and PCT Rule 4.10, 35 U.S.C. §119(e), et seq, the present application claims priority to, is related to, and is a U.S. national stage application of International App. No. PCT/IL2010/000772, filed on Sep. 20, 2010, which claims priority to U.S. provisional applications 61/244,046 and 61/351,875, filed on Sep. 20, 2009 and Jun. 5, 2010, respectively. The foregoing are hereby incorporated into this application by reference.

BACKGROUND

Packaging of electronic devices, such as light emitting diodes (LEDs) and other devices, represent a major cost in the production of electronic parts. In one non-limiting example, LEDs which offer long lifetime, compact form factor, superior energy efficiency, and RohS compliancy are expensive due to the packaging requirements which include sealing, optics, phosphor and efficient heat conduction. There have been numerous efforts to reduce the cost of the electronic device packaging by using silicon based wafer level assembly technologies. However, these approaches still require a carrier chip for the electronic device and in most cases the carrier chip doubles the cost, and in the case of an LED triples the heat resistivity. There is thus a long felt need for a wafer level package for electronic device which does not require any carrier chip and allows for connection to the electronic device die.

SUMMARY

Some aspects of the present disclosure are directed to placing the electronic device on a first face of substrate, and providing electrical contact to the electronic device from the region of a second face of the substrate by producing a vertical interconnect access (VIA) connection to the electronic device, the VIA insulated from the substrate. In an exemplary embodiment, a pass through hole is formed in the substrate to a metal pad on the electronic device, and an insulated passivation layer is formed to cover the surface area of the hole. A passage is then formed through the insulated passivation layer, and a metal layer is disposed therein providing electrical contact to the metal pad from the region of a second face of the substrate.

In one embodiment an electronic device package is enabled, the electronic device package comprising: an electronic device comprising a first contact point; a metal pad disposed to provide electrical connection to the first contact point; a substrate comprising a first face and a second face opposing the first face of the substrate, the first face of the substrate adjacent a face of the electronic device; and a vertical interconnect access (VIA) passing through the substrate from the second face of the substrate to the metal pad, the VIA exhibiting: a pass through extending through the substrate from the first face to the second face; a metal layer disposed within the pass through arranged to provide electrical connectivity to the metal pad from an area adjacent the second face of the substrate; and an electrically insulating first passivation layer disposed between the metal layer and the substrate arranged to provide electrical insulation between the substrate and the metal layer.

In one embodiment the electrically insulating first passivation layer is constituted of a polymer. In another embodiment the electronic device package further comprises a second passivation layer, the second passivation layer at least partially contactingly encasing the metal layer.

In one further embodiment the second passivation layer is constituted of solder mask material. In one yet further embodiment the substrate is constituted of silicon.

In another yet further embodiment the electronic device exhibits a first face, and the metal pad is disposed on the first face. In another yet further embodiment the via extends through the metal pad.

In one embodiment the electronic device is constituted of a light emitting diode. In another embodiment the electronic device further comprises a second contact point electrically different from the first contact point and the substrate is constituted of a conductive material providing electrical connection to the second contact point.

In one further embodiment the electronic device package further comprises a spacer element affixed to the substrate, the spacer element defining a location for the attachment of the electronic device to the substrate. In one yet further embodiment the spacer element is constituted of a reflective polymer.

In another further embodiment the electronic device package further comprises an optically transparent cover, the electronic device disposed between the substrate and the optically transparent cover. In one yet further embodiment the optically transparent cover comprises at least one of: a lens; a diffusing element; a phosphor coating; a color changing material coating; an anti-reflective coating; and an optical filter. In another yet further embodiment the electronic device package further comprises a spacer element affixed to the substrate, the spacer element defining a location for the attachment of the electronic device to the substrate and further defining a location for attachment of the optically transparent cover.

Independently, a method of forming an electronic device package is provided, the method comprising: providing an electronic device comprising a first contact point; depositing a metal pad to provide electrical connection to the first contact point; providing a substrate comprising a first face and a second face opposing the first face of the substrate; attaching the provided electronic device to the provided substrate such that the first face of the provided substrate is adjacent a face of the provided electronic device; etching a vertical interconnect access (VIA) from the second face of the substrate to the metal pad; applying an electrically insulating first passivation layer to the second face of the substrate, the electrically insulating first passivation layer in contact with a surface of the etched via; drilling a contact hole through the electrically insulating first passivation layer at an apex of the etched via to at least contact the deposited metal pad; and depositing a metal layer to the second face of the electrically insulating first passivation layer so as to provide electrical conductivity to the deposited metal pad from an area adjacent the second face of the substrate.

In one embodiment the applied electrically insulating first passivation layer is constituted of a polymer. In another embodiment the method further comprises applying a second passivation layer to at least partially contactingly encase the deposited metal layer.

In one further embodiment the second passivation layer is constituted of solder mask material. In one yet further embodiment the substrate is constituted of silicon.

In another yet further embodiment the provided electronic device exhibits a first face associated with the first contact point, and the metal pad is deposited on the first face. In one yet further embodiment the drilling extends through the deposited metal pad. In another yet further embodiment the electronic device is constituted of a light emitting diode.

In one embodiment the provided electronic device comprises a second contact point electrically different from the first contact point and the attached substrate is constituted of a conductive material, and the method further comprises depositing a second metal pad in contact with the second contact point.

In one further embodiment the method further comprises: providing a spacer element; and affixing the provided spacer element to the provided substrate, the spacer element defining a location for the attaching of the provided electronic device to the provided substrate. In one yet further embodiment the provided spacer element is constituted of a reflective polymer.

In another further embodiment the method further comprises: providing an optically transparent cover; and affixing the provided optically transparent cover such that the provided electronic device is disposed between the provided substrate and the provided optically transparent cover. In one yet further embodiment the provided optically transparent cover comprises at least one of: a lens; a diffusing element; a phosphor coating; a color changing material coating; an anti-reflective coating; and an optical filter. In another yet further embodiment the method further comprises providing a spacer element, wherein the provided spacer element defines a location for the affixing of the provided optically transparent cover.

The present devices and methods are applicable to LED systems, but also in other instances they may apply to power ICs, RF components, micro electro mechanical (MEMs) components and so on.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION

Figure 1:
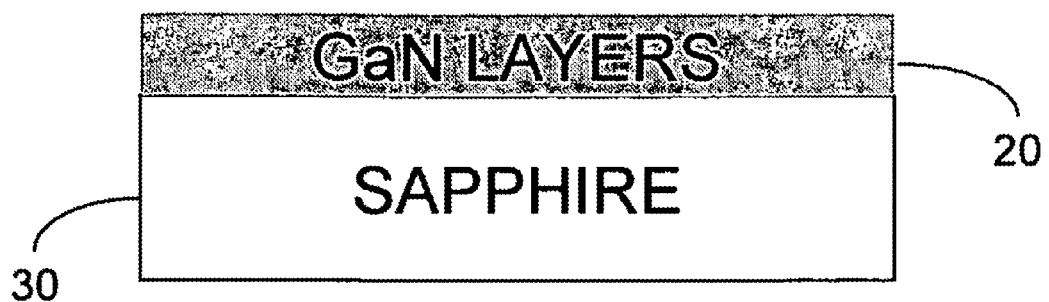
FIGS. 1-13 illustrate steps in the production of a horizontal type LED package according to certain embodiments.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIGS. 1-25 are described in an embodiment where an LED package is being produced, however this is not meant to be limiting in any way and the same apparatus and methods can be used for the production of any electronic device having electrical contact points without exceeding the scope.

FIG. 1 illustrates a block diagram of the first stage of the production of an electronic package 10, comprising electronic component 20, illustrated without limitation as a horizontal type LED 20. Horizontal type LED 20 is comprised of compound substrates such as GaN, InGaN or GaAs layers and is epitaxially grown on a GaAs, sapphire, silicon carbide (SiC) or other wafer substrate 30. GaN for LEDs, RF components and various other high power electronics is typically grown on a sapphire substrate using an MOCVD machine. Other embodiments of electronic component 20 may be constituted of GaAs for lasers, LEDs, VECSELs or RF components, or InP, or InGaP, or InGaAs for lasers, VECSELS or RF components, similarly grown on wafer substrate 30.

Figure 2:
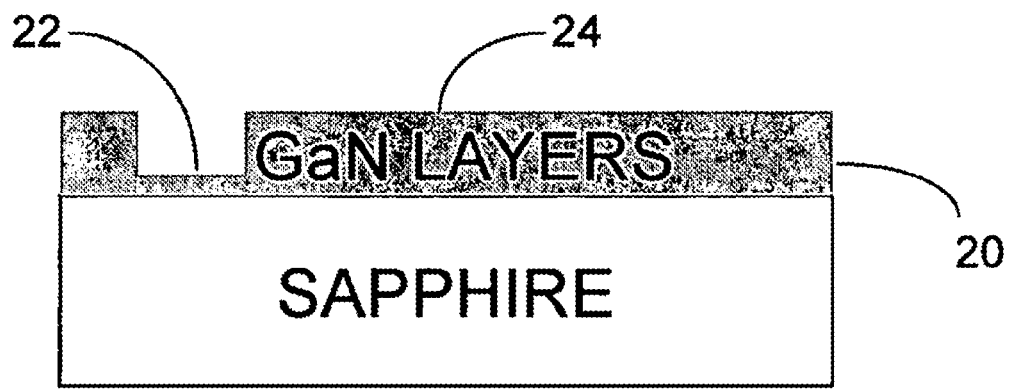

FIG. 2 illustrates a subsequent stage of production of electronic package 10, wherein a first contact point 22 is exposed in horizontal type LED 20 by etching, first contact point 22 constituted of a portion of a first layer doped with a first dopant type and a second contact point 24, constituted of a second layer doped with a second dopant type of horizontal type LED 20 is exposed. First contact point 22 is electrically different from second contact point 24. For the sake of clarity, the below will be described in an embodiment where first contact point 22 of horizontal type LED 20 is N doped and second contact point 24 is P doped, however this is not meant to be limiting in any way. In another embodiment first contact point 22 of horizontal type LED 20 is P doped and second contact point 24 of horizontal type LED 20 is N doped.

Figure 3:
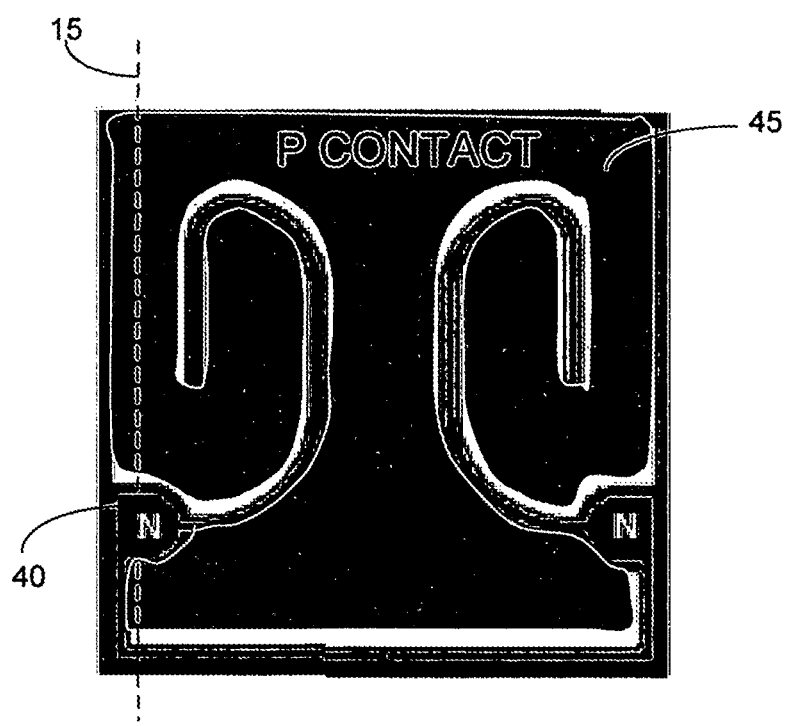
Figure 4:
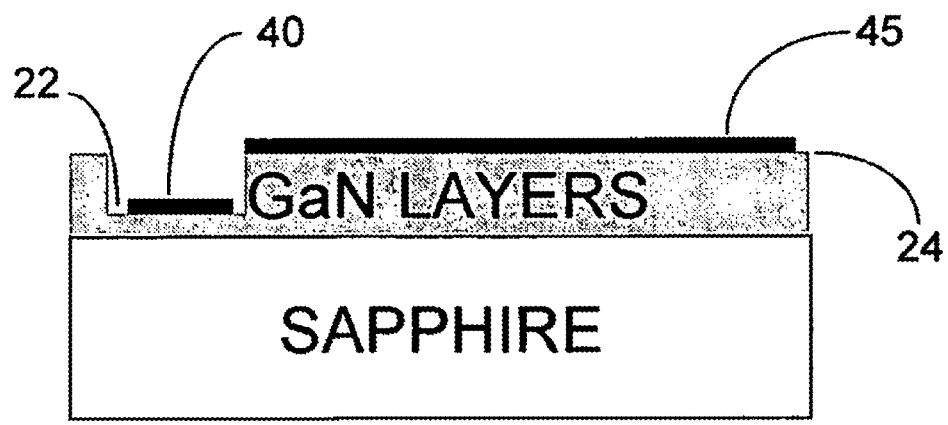

FIGS. 3-4 illustrates a subsequent stage of production of electronic component 10, wherein a first metal pad 40 is deposited on a portion of first contact point 22 of horizontal type LED 20 and a second metal pad 45 is applied to at least a portion of second contact point 24 of horizontal type LED 20, as shown in FIGS. 3 and 4, where FIG. 3 illustrates a top view of horizontal type LED 20 and FIG. 4 illustrates a side view of horizontal type LED 20 along a line 15. In one preferred embodiment first and second metal pads 40, 45 are comprised of aluminum. In another embodiment, first and second metal pads 40, 45 are comprised of any of: gold, nickel and copper. In one embodiment first and second metal pads 40, 45 are defined using a lift off technique where metal is deposited into predefined openings in a photo-resist. In another embodiment first and second metal pads 40 and 45 are defined using an etching technique where metal is blanket coated over horizontal type LED 20, a photo-resist is applied and patterned and then the metal is etched from regions exposed from photo-resist. In both embodiments the photo-resist is subsequently removed. The specific shape of first metal pad 40 and second metal pad 45 are determined by the electrical and operational requirements. In one embodiment first metal pad 40 is provided to be as small as possible, so as to minimize the amount of light whose passage is blocked by first metal pad 40, and second metal pad 45 is provided to be as large as possible, so as to maximize the amount of light reflected from horizontal type LED 20 towards the direction of first metal pad 40.

Figure 5:
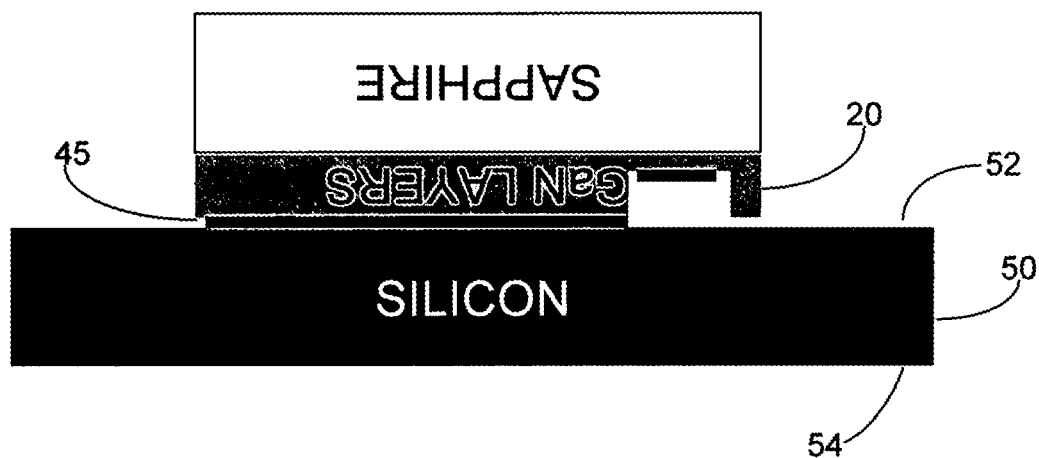

In one embodiment smaller electronic components 10 are singulated from a wafer of electronic components 20 using a dicing saw or scribe and break technique. Horizontal type LED 20 is bonded onto a first face 52 of a substrate 50, as illustrated in FIG. 5, with second metal pad 45 adjacent to first face 52 of substrate 50. Substrate 50 further comprises a second face 54, opposite first face 52. In one embodiment substrate 50 includes functional elements such as control or drive electronics. Advantageously, process temperatures as described herein are below the damage threshold of electronic functional elements or components. In one embodiment substrate 50 is comprised of silicon. In one embodiment substrate 50 is non-conductive. In another embodiment substrate 50 is doped so as to be conductive. In one embodiment the bonding is done using: a non-conductive epoxy; a conductive epoxy; a thermally conductive epoxy, with a thermal conduction of greater than 1 W/mk; or eutectic bonding such as gold tin bonding. In one embodiment the bonding is done with a non-conductive polymer, which exhibits enough viscosity to fill in any surface topographies in first or second metal pad 45 and further exhibits enough compliancy to respond to any thermal expansion mismatch between horizontal type LED 20 and substrate 50. In one embodiment phosphor material or a transparent encapsulation material such as silicone is deposited around horizontal type LED 20.

Figure 6:
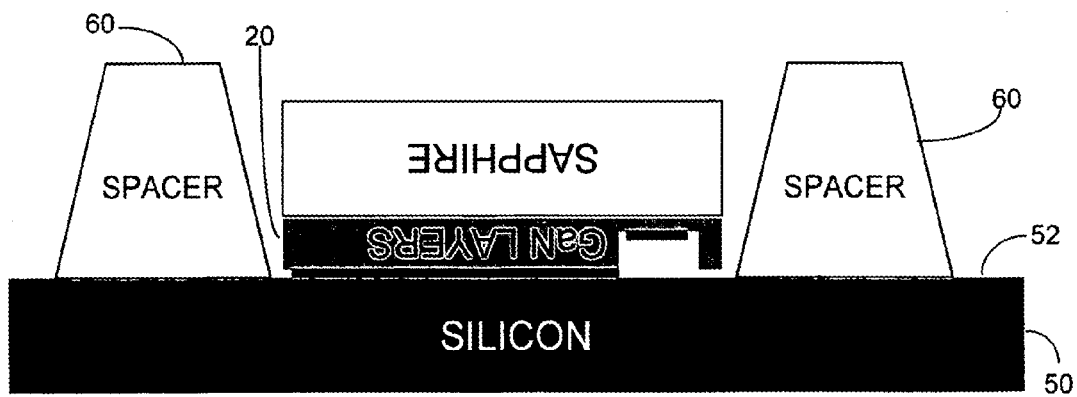

In one embodiment, as illustrated in FIG. 6, first face 52 of substrate 50 includes spacer element 60 arranged at predetermined locations of first face 52 and extending away from first face 52, and horizontal type LED 20 is bonded to substrate 50 at a location defined by spacer element 60. Spacer element 60 is preferably constituted of a thermosetting or thermoplastic material, and in one embodiment is constituted of a ring like structure defining a location within the inner space of the ring like structure for attaching horizontal type LED 20 to substrate 50. Thus, FIG. 6 illustrates a cut away view with a portion of spacer element 60 removed for clarity. In another embodiment a plurality of spacer elements are provided defining the location for attaching horizontal type LED 20 to substrate 50. In one embodiment the inner wall of spacer element 60 facing horizontal type LED 20 exhibits an angle to a perpendicular plane extending from first face 52 so as to act as a reflector for light exiting horizontal type LED 20. In a preferred embodiment, spacer element 60 is reflective to light in the operative range of horizontal type LED 20. In one embodiment spacer element 60 is made reflective by including white or metallic micron and/or nano-particles such as aluminum, zinc oxide, and aluminum oxide. In an alternative embodiment, spacer element 60 is coated with aluminum or a dielectric thin film filter material to enhance the reflectivity thereof. In one embodiment spacer element 60 is molded onto substrate 50, and in another embodiment spacer element 60 is injection or cast molded and subsequently bonded to substrate 50.

Figure 7:
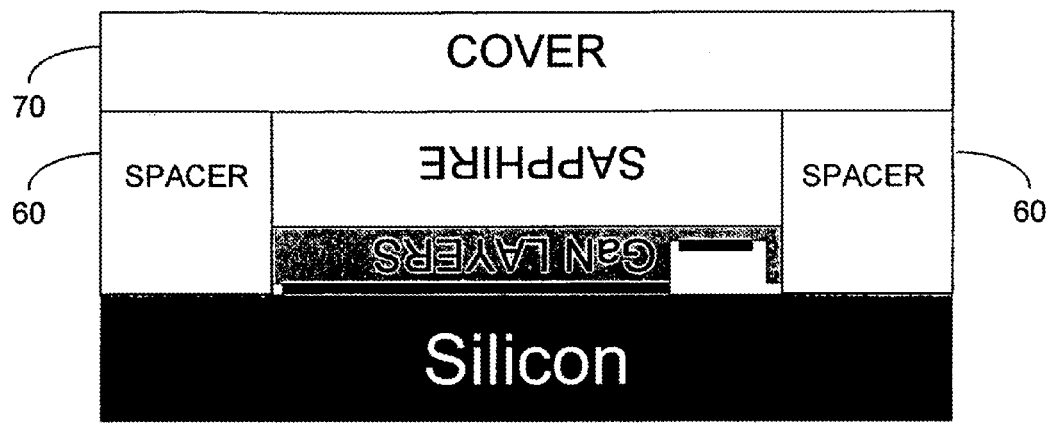

FIG. 7 illustrates a subsequent stage of production of electronic component 10, wherein a cover 70 is placed on spacer element 60. In one embodiment cover 70 is secured to spacer element 60 with epoxy or other adhesive. Cover 70 is preferably comprised of an optically transparent material such as glass or a polymer, without limitation. In one embodiment cover 70 includes optics such as a lens, diffusing elements, phosphor or other color changing material coating, anti-reflective coating or optical filters, without limitation. In one embodiment cover 70 contains enclosed cavities with phosphor or quantum dot material providing additional environmental protection to the material. In an embodiment where spacer element 60 is not applied to substrate 50, cover 70 may comprise a spacer element, or elements, defining the distance of cover 70 from substrate 50. In a preferred embodiment the thickness of cover 70 is less than 400 microns.

The above has been described in an embodiment wherein wafer substrate 30 remains during production of electronic component 10, however this is not meant to be limiting in any way. In one particular embodiment wafer substrate is removed prior to the formation of first metal pad 40 and second metal pad 45, without exceeding the scope.

Figure 8:
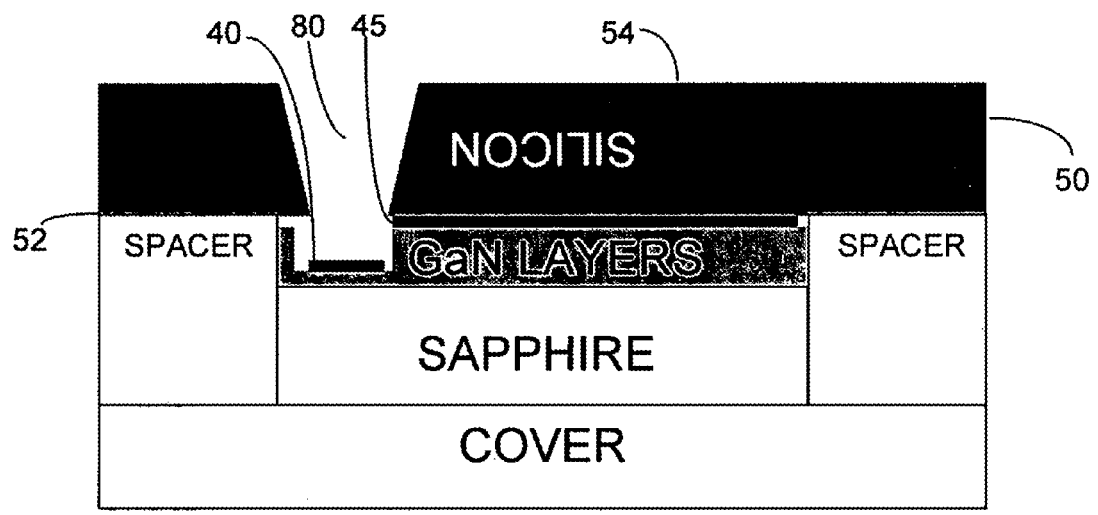

FIG. 8 illustrates a 180 degree rotated view of electronic package 10 of FIG. 5, and further illustrating a subsequent stage of production of electronic component 10 wherein a pass through 80 is etched through substrate 50 from second face 54 through to first face 52 to expose first metal pad 40. In one embodiment the etching of pass through 80 is performed by deep reactive ion etching (DRIE). In an embodiment where horizontal type LED 20 is bonded to substrate 50 using an electrically conductive material and substrate 50 is doped so as to be conductive, electrical connection to second metal pad 45 is provided at second face 54 of substrate 50 by the combination of second metal pad 45 and substrate 50. In an exemplary embodiment pass through 80 is conically shaped with an apex formed in the direction of first face of substrate 50.

Figure 9:
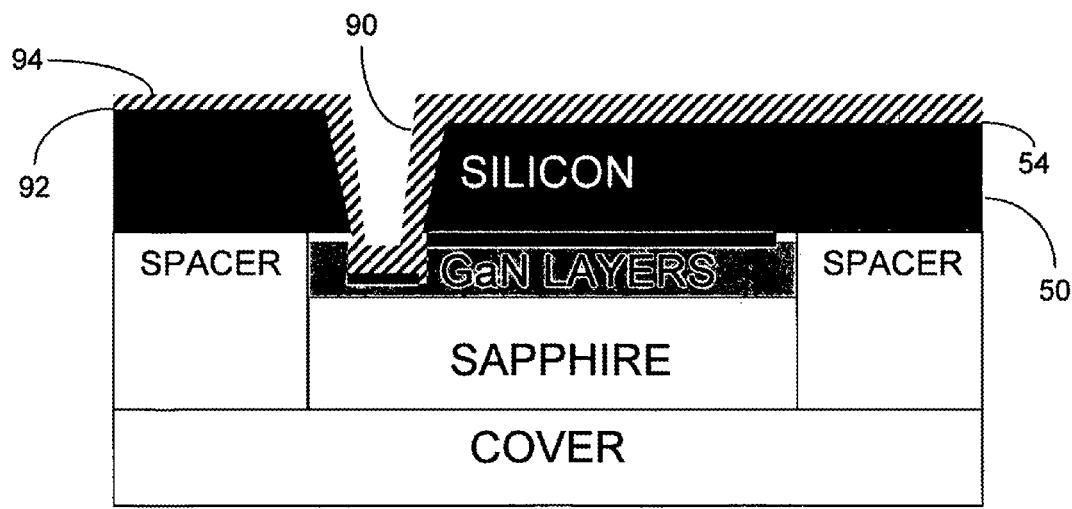

FIG. 9 illustrates a subsequent stage of production of electronic component 10, wherein an electrically insulating first passivation layer 90 is applied to second face 54 of substrate 50. Electrically insulating first passivation layer 90 exhibits a first surface 92 is contact with the inner surface of pass through 80 and second face 54 of substrate 50. Electrically insulating first passivation layer 90 further exhibits a second surface 94 opposing first surface 92. In one embodiment electrically insulating first passivation layer 90 is comprised of an organic material such as a solder mask, an epoxy or an electrophoretic paint, and in another embodiment is an inorganic material such as SiO2, SiN, AlN, or Al2O3. In one embodiment electrically insulating first passivation layer 90 is comprised of a non-conductive polymer. In a preferred embodiment electrically insulating first passivation layer is comprised of a thermally conductive material, such as SiN or AlN, so as to enhance thermal conductance of electronic package 10. In one embodiment the thickness of electrically insulating first passivation layer 90 ranges from 1 to 40 microns, depending on the material and required electrical passivation.

Figure 10:
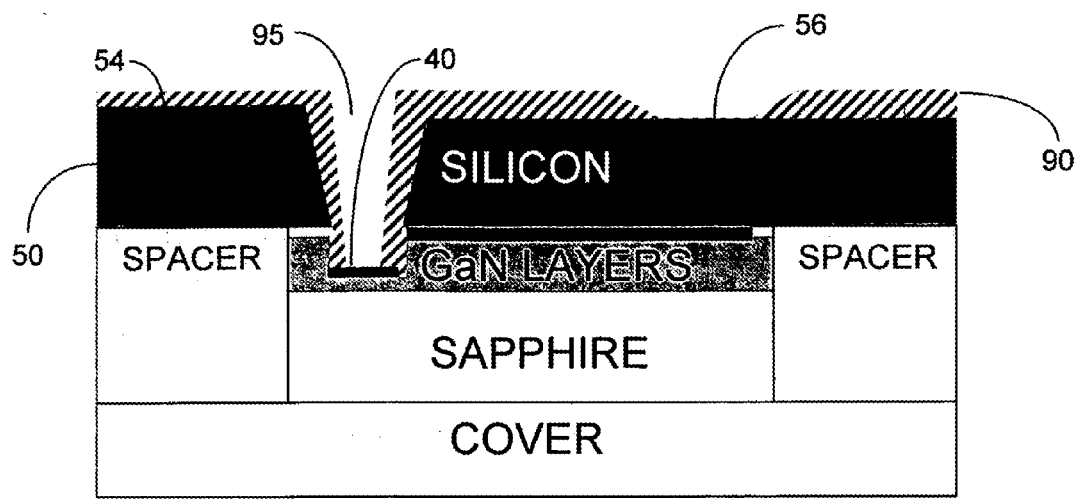
Figure 11:
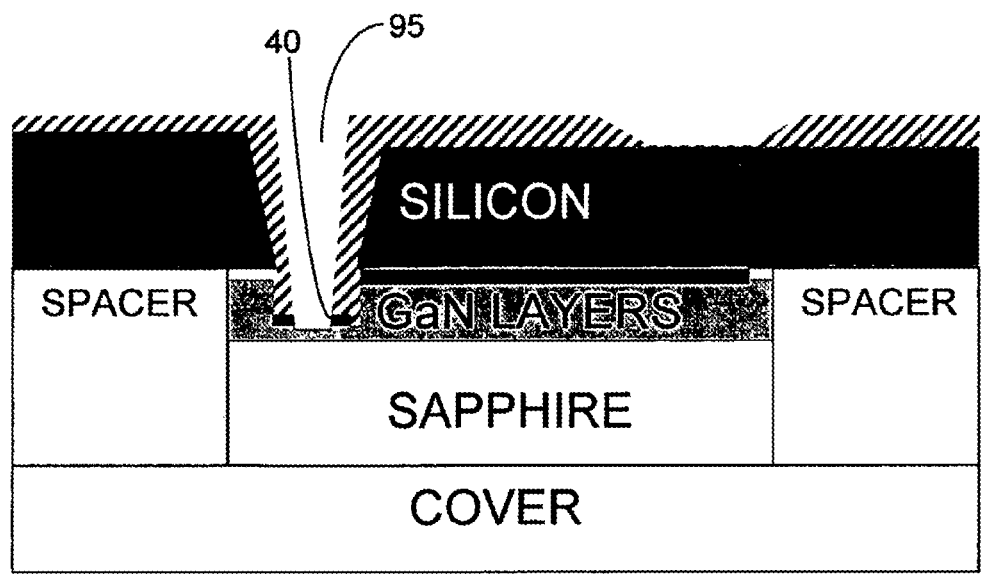

FIG. 10 illustrates a subsequent stage of production of electronic component 10, wherein a hole 95 is formed through a portion of first passivation layer 90, preferably by drilling through a central axis of pass through 80 and the portion of first passivation layer 90 covering the apex of pass through 80, thereby exposing first metal pad 40. A portion of electrically insulating first passivation layer 90 covering second face 54 is further exposed, by drilling or etching thereby exposing a portion 56 of second face 54. In one embodiment electrically insulating first passivation layer 90 is drilled with a laser. In another embodiment, where SiN or MN are used for electrically insulating first passivation layer 90, a plasma etch is used for drilling. In one embodiment, the drilling of hole 95 is stopped at metal pad 40. In another embodiment, illustrated in FIG. 11, hole 95 passes through metal pad 40.

Figure 12:
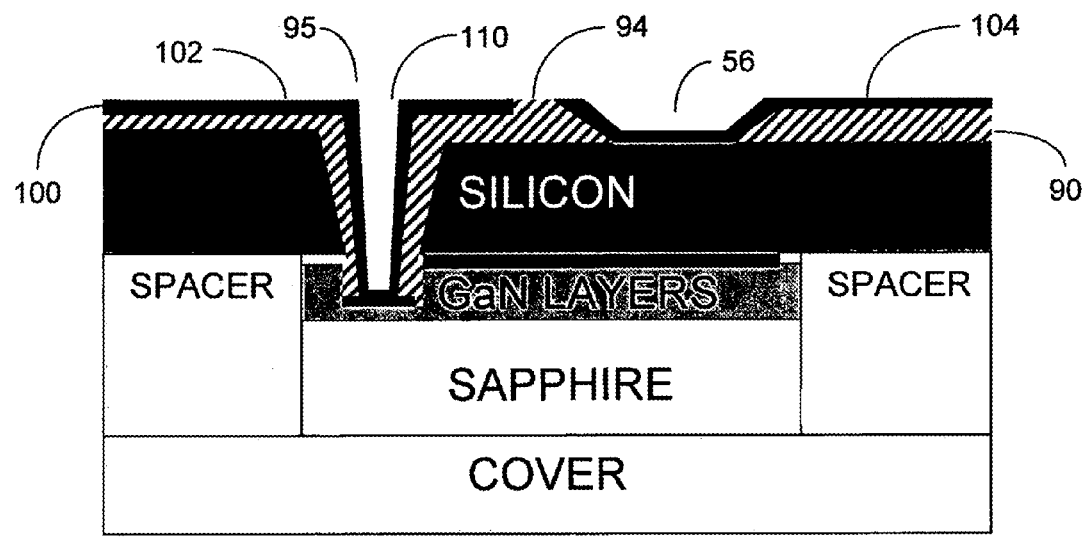

FIG. 12 illustrates a subsequent stage of production of electronic component 10, wherein a metal layer 100, comprising a first portion 102 and a second portion 104 is applied to second surface 94 of electrically insulating first passivation layer 90. Specifically, first portion 102 of metal layer 100 is applied inside hole 95 and in one embodiment, on at least a portion of second face 94 of electrically insulating first passivation layer 90 external of hole 95, thus forming an insulated vertical interconnect access (VIA) 110 providing an electrical connection to first metal pad 40 from the region of second face 54 of substrate 50. Second portion 104 of metal layer 100 is applied to portion 56 of substrate 50 and in one embodiment, on at least a portion of second surface 94 of electrically insulating first passivation layer 90 adjacent portion 56 of substrate 50, thereby providing an electrical connection to second metal pad 45 via substrate 50 at portion 56.

The above has been described in an embodiment wherein substrate 50 is conductive, however this is not meant to be limiting in any way. In another embodiment an additional insulated VIA 110 is formed to provide electrical contact to second metal pad 45 from the region of second surface 54 of substrate 50. First portion 102 and second portion 104 of metal layer 100 are electrically separated from each other.

In one embodiment metal layer 100 is applied by sputtering a metal seed layer. In one further embodiment the seed layer is patterned using electrophoretic deposited photo resist, spray coating resist, or thick resist, in one particular embodiment to a thickness greater than 50 microns. In one embodiment the resist is patterned to create electrical routing connections and under bump metallization (UBM) for solder balls. A further metal layer, in one embodiment between 10 and 40 microns, is then grown on the exposed regions by electroplating. The photo-resist is then removed and the exposed seed layer is etched using a chemical dry or wet etch. In one embodiment the metal seed layer is comprised of any of: aluminum, titanium, chrome, nickel, palladium, platinum, and copper; and the electroplating is comprised of any of: nickel, aluminum and copper. In another embodiment, additional metals such as nickel, titanium, or chrome are used to promote adhesion and to reduce corrosion and electromigration.

Figure 13:
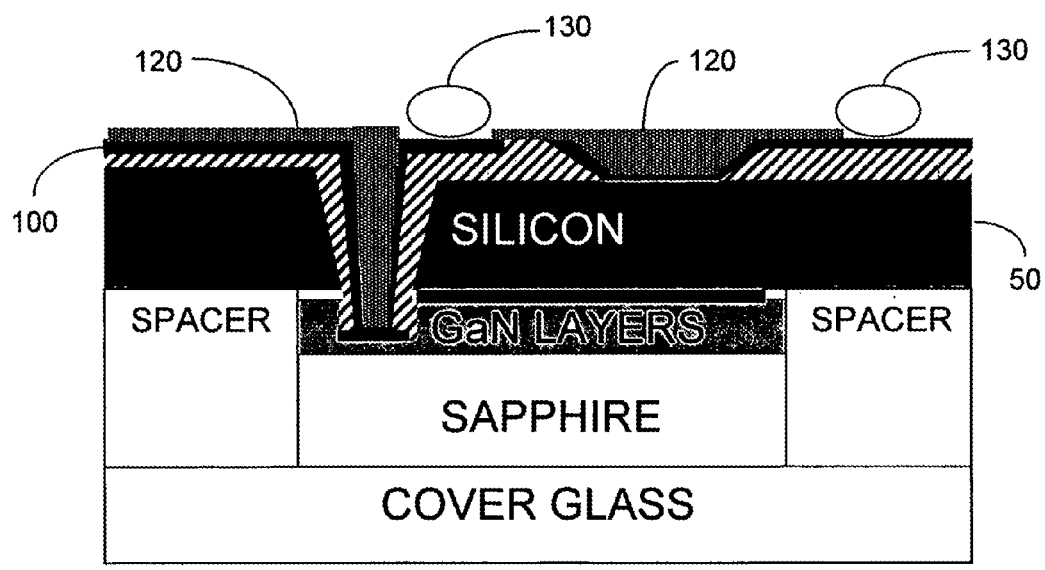

FIG. 13 illustrates a subsequent stage of production of electronic component 10, wherein an electrically insulating second passivation layer 120 is applied to at least partially cover metal layer 100. In one embodiment electrically insulating second passivation layer 120 is comprised of solder mask and openings are provided for the electrical and thermal contacts. In one embodiment solder balls 130 are attached to metal layer 100 through openings in electrically insulating second passivation layer 120. In one embodiment solder balls 130 are used to conduct heat from e electronic package 10 to a PCB or other electrical board to which electronic package 10 is attached. In another embodiment, thermally conductive underfill material is used to conduct the heat.

In another embodiment, not illustrated, an additional metal heat conducting pad is deposited on electrically insulating first passivation layer 90 to provide a non-electrically conducting, heat conduction path.

Figure 14:
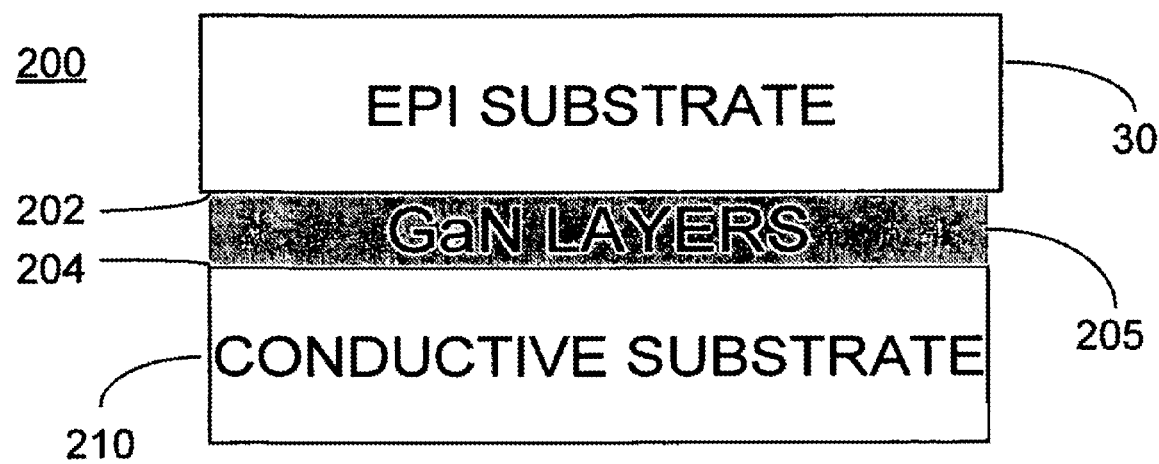
FIGS. 14-25 illustrate steps in the production of a vertical type LED package according to certain embodiments.

FIG. 14 illustrates a block diagram of the first stage of the production of a vertical type LED package 200, comprising a vertical type LED 205. Vertical type LED 205 is comprised of compound substrates such as GaN, InGaN or GaAs layers and is epitaxially grown on a GaAs, sapphire, silicon carbide (SiC) or other wafer substrate 30. GaN for LEDs, RF components and various other high power electronics is typically grown on a sapphire substrate using an MOCVD machine. Other embodiments of electronic component 20 may be constituted of GaAs for lasers, LEDs, VECSELs or RF components, or InP, or InGaP, or InGaAs for lasers, VECSELS or RF components, similarly grown on wafer substrate 30.

Vertical type LED 205 comprises a first contact point 202, constituted of a first layer doped with a first dopant type and a second contact point 204, constituted of a second layer doped with a second dopant type. For the sake of clarity, the below will be described in an embodiment where first contact point 202 of vertical type LED 205 is N doped and second contact point 204 is P doped, however this is not meant to be limiting in any way. In another embodiment first contact point 202 of vertical type LED 205 is P doped and second contact point 204 of vertical type LED 205 is N doped.

Vertical type LED 205 is bonded to a conductive substrate 210, in one embodiment being one of: copper, aluminum and silicon. In one embodiment the bonding is done using: a non-conductive epoxy; a conductive epoxy; a thermally conductive epoxy, with a thermal conduction of greater than 1 W/mk; or an eutectic bond such as gold tin bonding. In one embodiment the bonding is done with a non-conductive polymer, which exhibits enough viscosity to fill in the valleys of the face of vertical type LED 205 associated with second contact point 204 and the face of conductive substrate 210 adjacent to vertical type LED 205 and exhibits sufficient compliancy to be responsive to any thermal expansion mismatch between conductive substrate 210 and vertical type LED 205.

In one embodiment phosphor material or transparent encapsulation material such as silicone, is deposited around vertical type LED 205.

Figure 15:
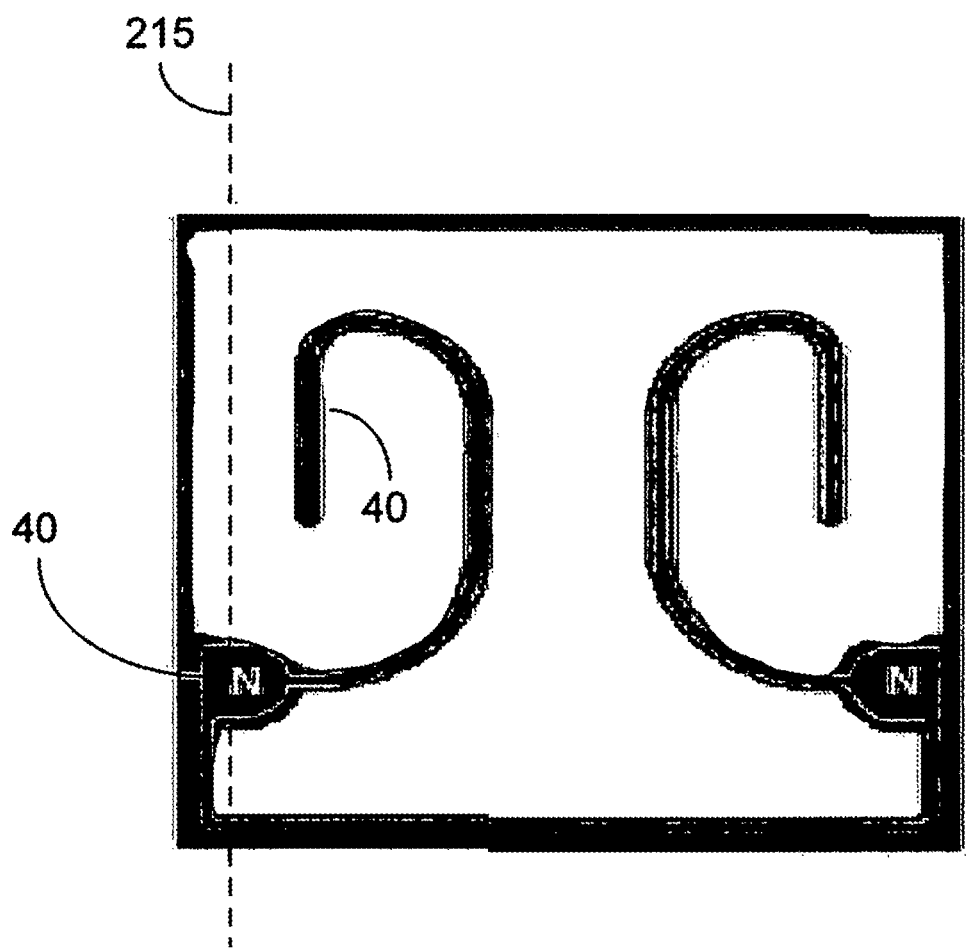
Figure 16:
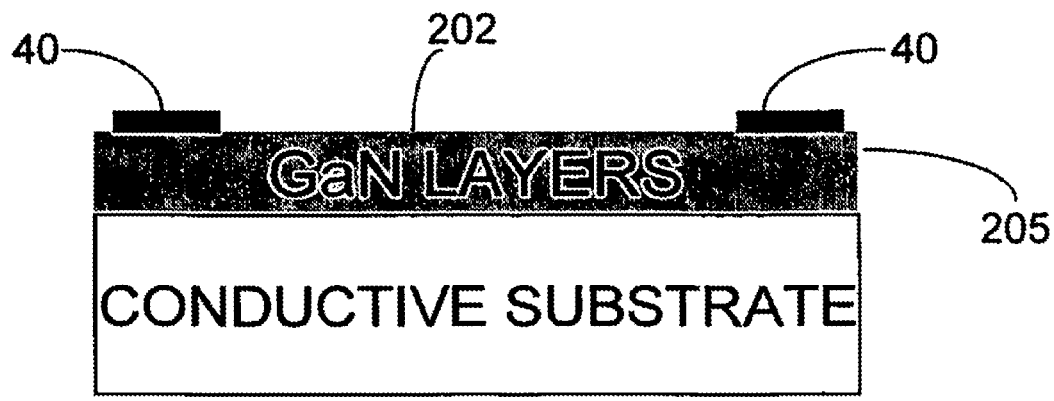

FIGS. 15 and 16 illustrate a subsequent stage of production of vertical type LED package 200, wherein wafer substrate 30 is removed preferably using a laser lift off process. FIG. 15 illustrates a top view of vertical type LED package 200 and FIG. 16 illustrates a side view of vertical type LED package 200 along line 215. One or more first metal pads 40 are deposited to cover a portion of first contact point 202. In one preferred embodiment first metal pads 40 are comprised of aluminum. In another embodiment first contact metal pads 40 are comprised of any of: gold, nickel and copper. In one embodiment first contact point metal pads 40 are fabricated from a transparent electrode material such as ITO or ZnO and cover the entire area of vertical type LED 205. In one embodiment first metal pads 40 are defined using a lift off technique where metal is deposited into predefined openings in a photo-resist. In another embodiment first contact point metal pads 40 are defined using an etching technique where metal is blanket coated over the wafer, a photo-resist is applied and patterned and then the metal is etched from regions exposed from photo-resist. In both embodiments the photo resist is subsequently removed. The specific shape of first contact point metal pads 40 are determined by the electrical and operational requirements. In one embodiment first contact point metal pads 40 are provided to be as small as possible, so as to minimize the amount of light whose passage is blocked by first metal pads 40.

Figure 17:
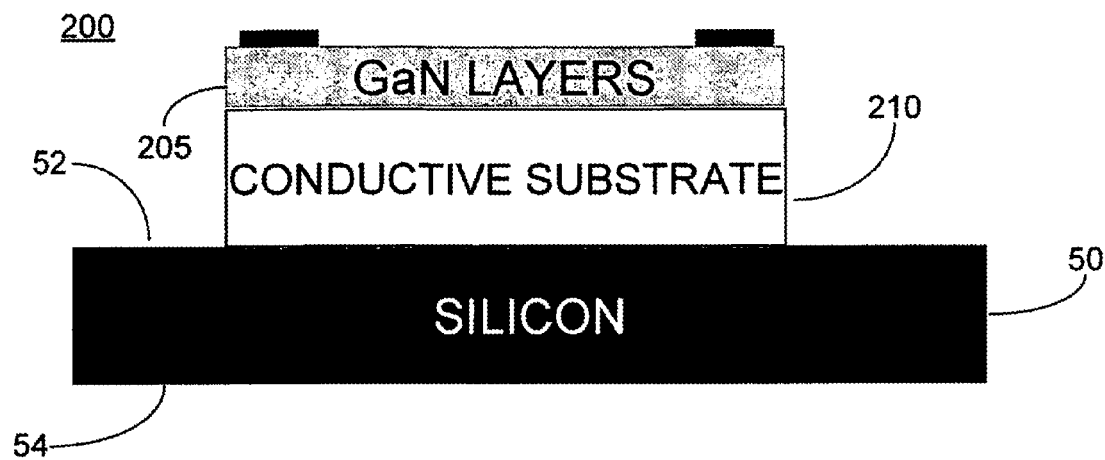

In one embodiment smaller vertical type LEDs 205 are singulated from a wafer of vertical type LEDs 205 using a dicing saw or scribe and break technique. Conductive substrate 210 is then bonded onto a first face 52 of a substrate 50, as illustrated in FIG. 17. Substrate 50 further comprises a second face 54, opposite first face 52. In one embodiment substrate 50 includes functional elements such as control or drive electronics. In one preferred embodiment the process temperatures are below the damage threshold of electronic components. In one embodiment substrate 50 is comprised of silicon. In one embodiment substrate 50 is non-conductive. In another embodiment substrate 50 is doped so as to be conductive. In one embodiment the bonding is done using: a non-conductive epoxy; a conductive epoxy; a thermally conductive epoxy, with a thermal conduction of greater than 1 W/mk; or eutectic bonding such as gold tin bonding. In one embodiment the bonding is done with a non-conductive polymer, which exhibits enough viscosity to fill in the valleys of conductive substrate 210 and substrate 50 and exhibits enough compliancy to deal with any thermal expansion mismatch between conductive substrate 210 and substrate 50.

Figure 18:
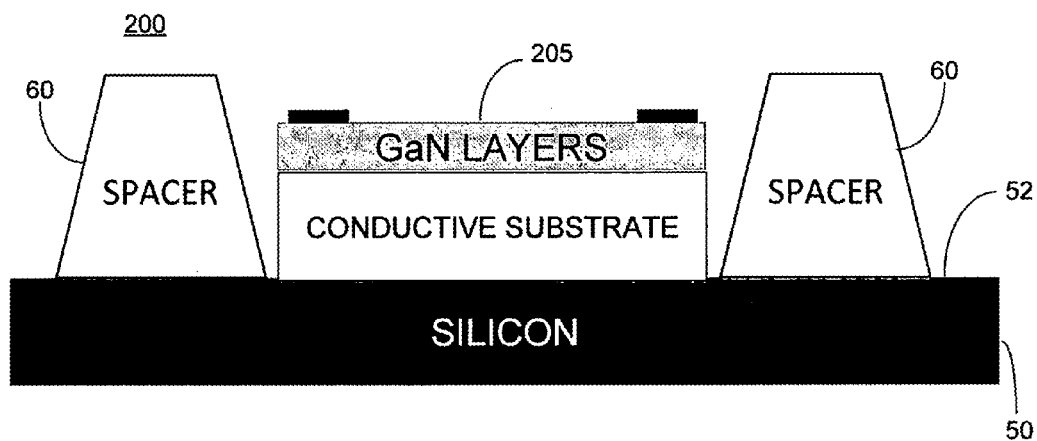

FIGS. 17 and 18 illustrate a subsequent stage of production of vertical type LED package 200, wherein wafer substrate 30 is removed preferably using a laser lift off process. In one embodiment, as illustrated in FIG. 18, first face 52 of substrate 50 includes spacer element 60 arranged at predetermined locations of first face 52 and extending away from first face 52, and vertical type LED 205 is bonded to substrate 50 at a location defined by spacer element 60. Spacer element 60 is preferably constituted of a thermosetting or thermoplastic material, and in one embodiment is constituted of a ring like structure defining a location within the inner space of the ring like structure for attaching vertical type LED 205 to substrate 50. Thus, FIG. 18 illustrates a cut away view with a portion of spacer element 60 removed for clarity. In another embodiment a plurality of spacer elements are provided defining the location for attaching vertical type LED 205 to substrate 50. In one embodiment the inner wall of spacer element 60 facing vertical LED 205 exhibits an angle to a perpendicular plane extending from first face 52 so as to act as a reflector for light exiting vertical type LED 205. In a preferred embodiment, spacer element 60 is reflective to light in the operative range of vertical type LED 205. In one embodiment spacer element 60 is made reflective by including white or metallic micron and/or nano-particles such as aluminum, zinc oxide, and aluminum oxide. In an alternative embodiment, spacer element 60 is coated with aluminum or a dielectric thin film filter material to enhance the reflectivity thereof. In one embodiment spacer element 60 is molded onto substrate 50, and in another embodiment spacer element 60 is injection or cast molded and subsequently bonded to substrate 50.

Figure 19:
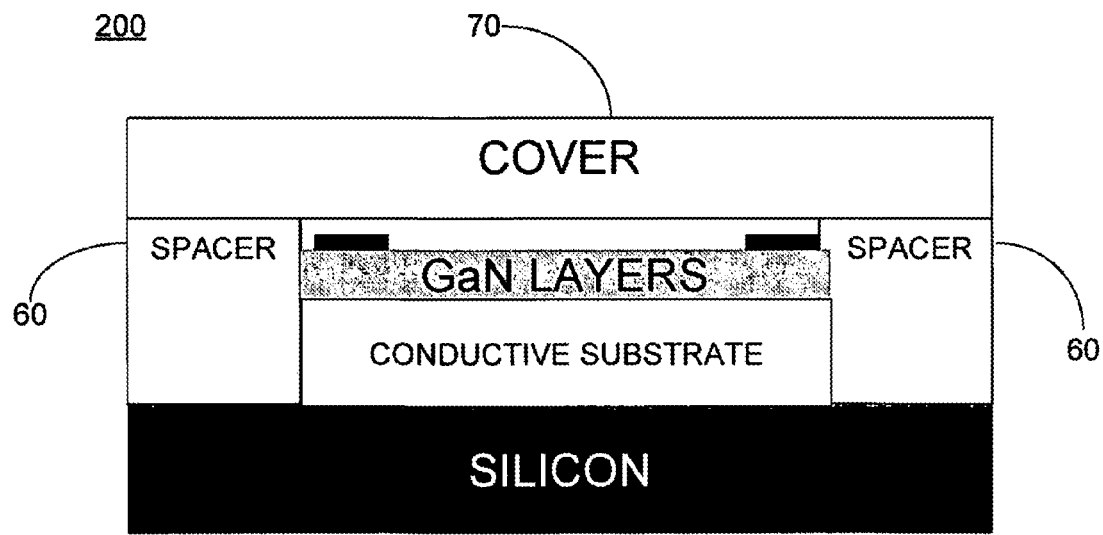

FIG. 19 illustrates a subsequent stage of production of vertical type LED package 200, wherein a cover 70 is placed on spacer element 60. In one embodiment cover 70 is secured to spacer element 60 with epoxy or other adhesive. Cover 70 is preferably comprised of an optically transparent material such as glass or a polymer, without limitation. In one embodiment cover 70 includes optics such as a lens, diffusing elements, phosphor or other color changing material, anti-reflective coating or optical filters, without limitation. In one embodiment cover 70 contains enclosed cavities with phosphor or quantum dot material providing additional environmental protection to the material. In an embodiment where spacer element 60 are not applied to substrate 50, cover 70 may comprise a spacer element, or spacer elements, defining the distance of cover 70 from substrate 50. In a preferred embodiment the thickness of cover 70 is less than 400 microns.

Figure 20:
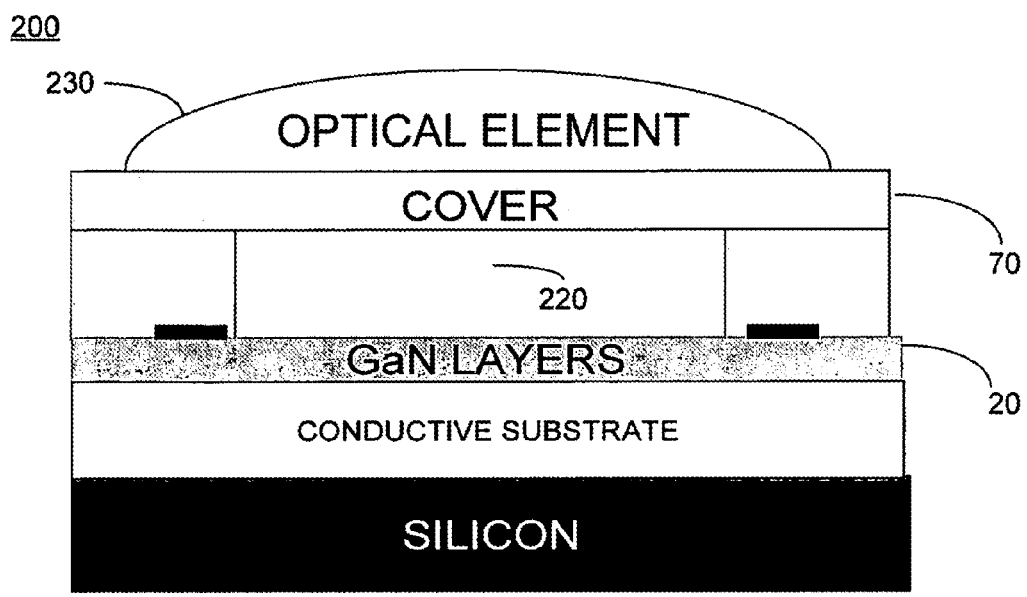

In one embodiment cover 70 contains enclosed cavities with phosphor or quantum dot material providing additional environmental protection to the material. In one embodiment an air cavity 220 is formed between cover 70 and vertical type LED 205, as illustrated in FIG. 20. Air cavity 220 provides a high thermal resistance and reduces the temperature in the cover. The reduced temperature increases the lifetime of phosphor or quantum dot material. To create air cavity 220, a photo definable material is in one embodiment deposited on cover 70. In one embodiment the photo definable material is any of: benzocyclobutene (BCB), solder mask material, SU8 and other polymer materials. After deposition, air cavity 220 is defined and imaged leaving material at boundaries of air cavity 220 to support contact to vertical type LED 205. Additional such cavities can be defined and multiple cover substrates can be used to define cavities for the phosphor material as well as for optical elements such as lenses or diffusers. In a preferred embodiment first contact point metal pads 40 are located under cavity interposers and not inside air cavity 220.

In one illustrated embodiment an optical element 230, illustrated without limitation as a lens, is provided on substrate 70. In one embodiment the shape of lens 230 is created by the surface tension of a drop of polymer or silicone material. In one embodiment substrate 70 is patterned to create specific drop shapes, sizes and surface qualities. Optical element 230 may be constituted of one or more of a lens, a diffusing element; a phosphor coating; a color changing material coating; an anti-reflective coating; and an optical filter.

Figure 21:
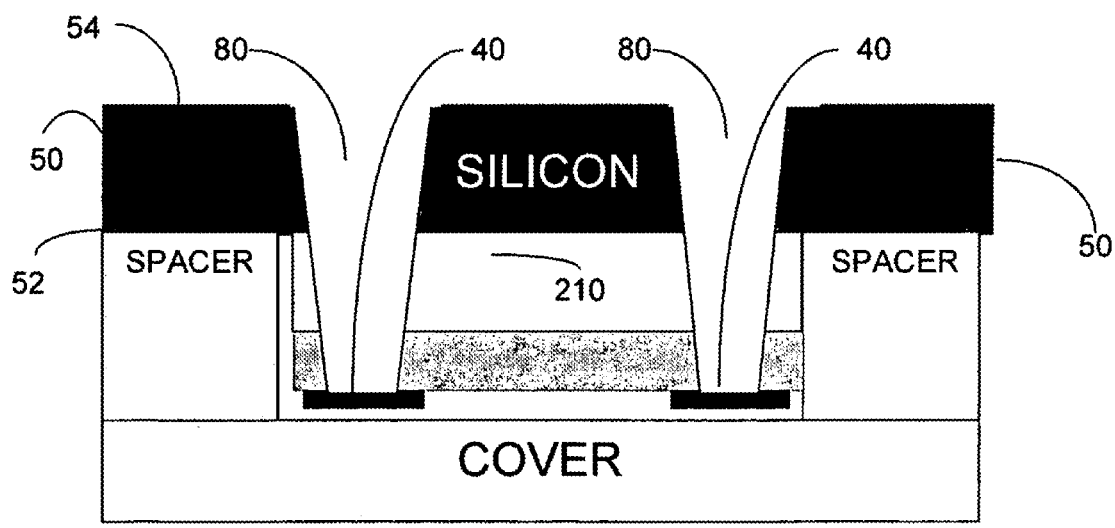

FIG. 21 illustrates a 180 degree rotated view of vertical type LED package 200 of FIG. 19 or 20, and further illustrating a subsequent stage of production of vertical type LED package 200 wherein a plurality of passthroughs 80 are etched through substrate 50 from second face 54 through to first face 52 to expose first metal pad 40. In one embodiment the etching of pass through 80 is performed by deep reactive ion etching (DR1E). In an embodiment where vertical type LED 205 is bonded using an electrically conductive material and substrate 50 is doped so as to be conductive, the electrical connection to second contact point 24 of vertical type LED 205 is acquired through substrate 50. In one embodiment (not shown) the etch uses conductive substrate 210 as an etch stop. In an embodiment where conductive substrate 210 is constituted of silicon, the etch can continue through conductive substrate 210. In an embodiment where conductive substrate 210 is constituted of metal, etching may be performed using a relevant chemical etch up to vertical type LED 205. Vertical type LED 20 is ablated using a UV laser until first metal pads 40 are reached.

Figure 22:
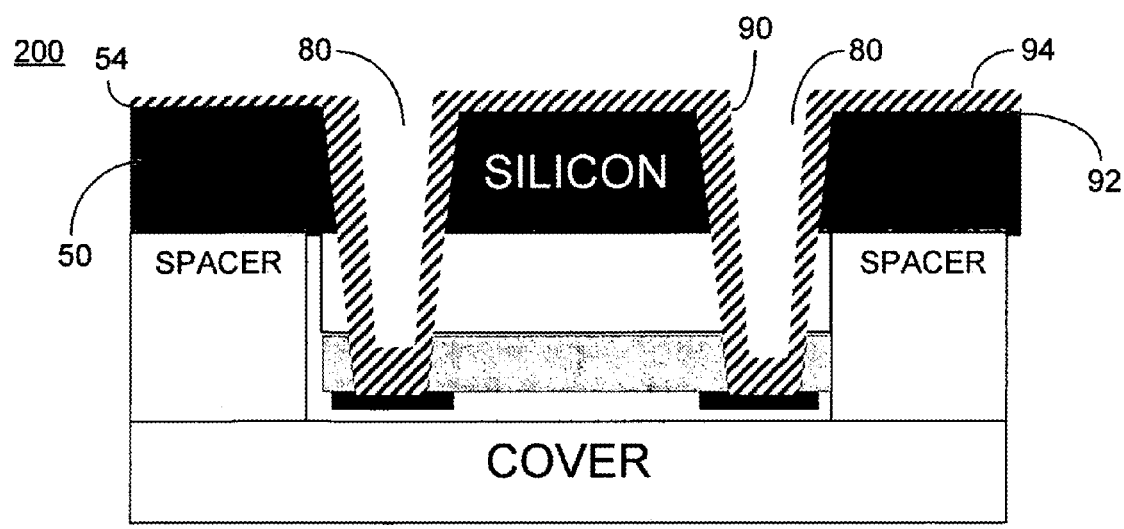

FIG. 22 illustrating a subsequent stage of production of vertical type LED package 200, wherein an electrically insulating first passivation layer 90 is applied to second face 54 of substrate 50. Electrically insulating first passivation layer 90 exhibits a first surface 92 is contact with the inner surface of pass through 80 and second face 54 of substrate 50. Electrically insulating first passivation layer 90 further exhibits a second surface 94 opposing first surface 92. In one embodiment electrically insulating first passivation layer 90 is comprised of an organic material such as a solder mask, an epoxy or an electrophoretic paint, and in another embodiment is an inorganic material such as SiO2, SiN, MN, or Al2O3. In one embodiment electrically insulating first passivation layer 90 is comprised of a non-conductive polymer. In a preferred embodiment electrically insulating first passivation layer is comprised of a thermally conductive material, such as SiN or AlN, so as to enhance thermal conductance of electronic package 10. In one embodiment the thickness of electrically insulating first passivation layer 90 ranges from 1 to 40 microns, depending on the material and required electrical passivation.

Figure 23:
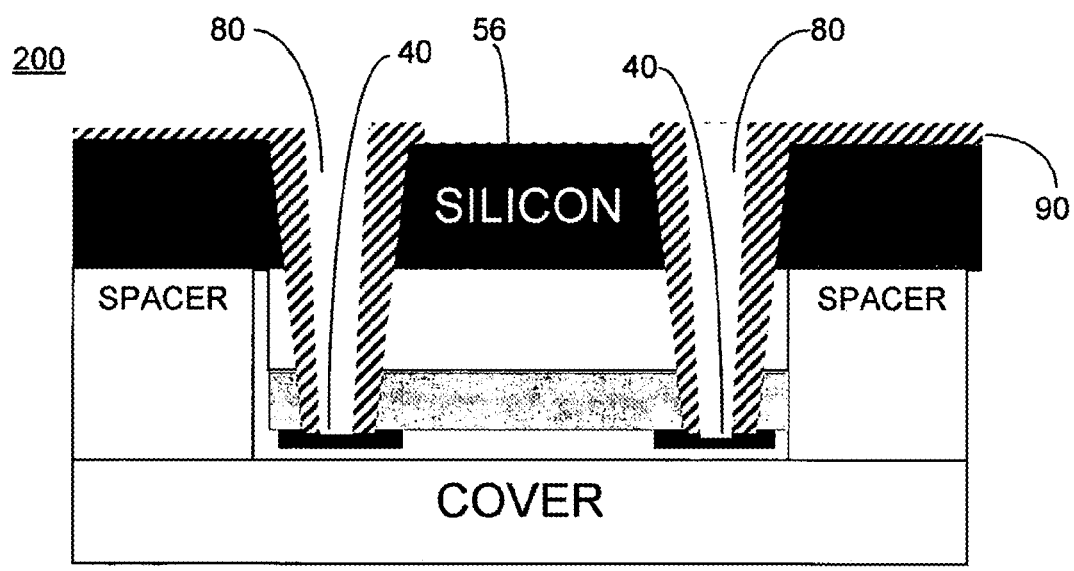

FIG. 23 illustrates a subsequent stage of production of vertical type LED package 200, wherein a hole 95 is formed through a portion of first passivation layer 90, preferably by drilling through a central axis of pass through 80 and the portion of first passivation layer 90 covering the apex of pass through 80, thereby exposing first metal pad 40. A portion of electrically insulating first passivation layer 90 covering second face 54 is further exposed, by drilling or etching thereby exposing a portion 56 of second face 54. In one embodiment electrically insulating first passivation layer 90 is drilled with a laser. In another embodiment, where SiN or AlN are used for electrically insulating first passivation layer 90, a plasma etch is used for drilling. In one embodiment, the drilling of hole 95 is stopped at metal pad 40. In another embodiment, as described above in relation to FIG. 11, hole 95 passes through metal pad 40.

Figure 24:
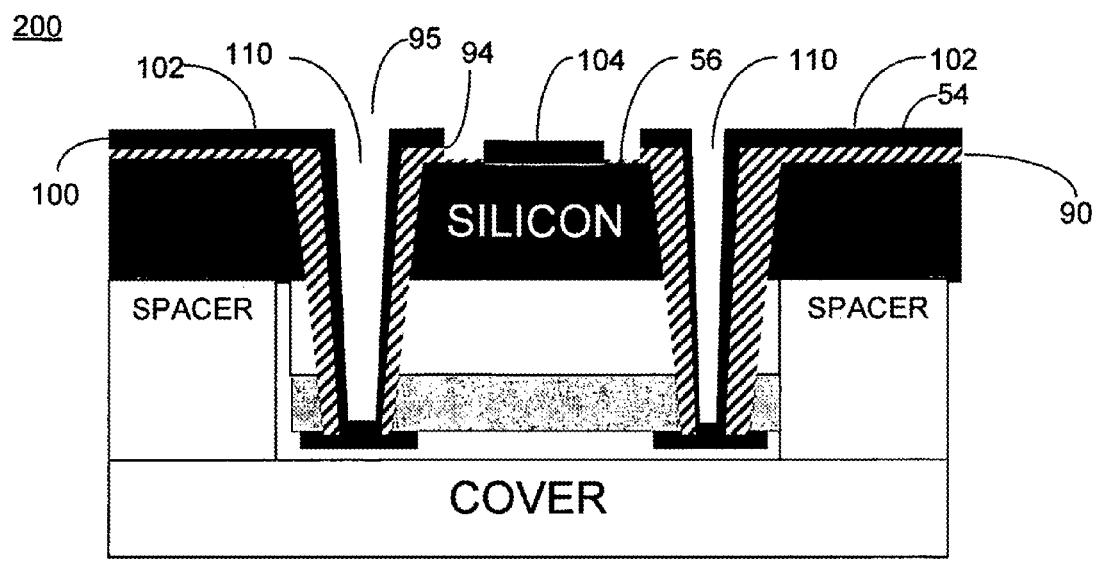

FIG. 24 illustrates a subsequent stage of production of vertical type LED package 200, wherein a metal layer 100 comprising a first portion 102 and a second portion 104 is applied to second face 94 of electrically insulating first passivation layer 90. Specifically, first portion 102 of metal layer 100 is applied inside hole 95 and in one embodiment, on at least a portion of second face 94 of electrically insulating first passivation layer 90 external of hole 95, thus forming an insulated VIA 110 providing an electrical connection to first metal pad 40 from the region of second face 54 of substrate 50. Second portion 104 of metal layer 100 is applied to at least a portion of portion 56 of substrate 50, thereby providing an electrical connection to second metal pad 45 of vertical type LED 205 via conductive substrate 210 and substrate 50.

The above has been described in an embodiment wherein substrate 50 is conductive, however this is not meant to be limiting in any way. In another embodiment an additional insulated VIA 110 is formed to provide electrical contact to second metal pad 45 from the region of second surface 54 of substrate 50. First portion 102 and second portion 104 of metal layer 100 are electrically separated from each other.

In one embodiment metal layer 100 is applied by sputtering a metal seed layer. In one further embodiment the seed layer is patterned using electrophoretic deposited photo resist, spray coating resist, or thick resist, in one particular embodiment to a thickness greater than 50 microns. In one embodiment the resist is patterned to create electrical routing connections and under bump metallization (UBM) for solder balls. A further metal layer, in one embodiment between 10 and 40 microns, is then grown on the exposed regions by electroplating. The photo-resist is then removed and the exposed seed layer is etched using a chemical dry or wet etch. In one embodiment the metal seed layer is comprised of any of: aluminum, titanium, chrome, nickel, palladium, platinum, and copper; and the electroplating is comprised of any of: nickel, aluminum and copper. In another embodiment, additional metals such as nickel, titanium, or chrome are used to promote adhesion and to reduce corrosion and electromigration.

Figure 25:
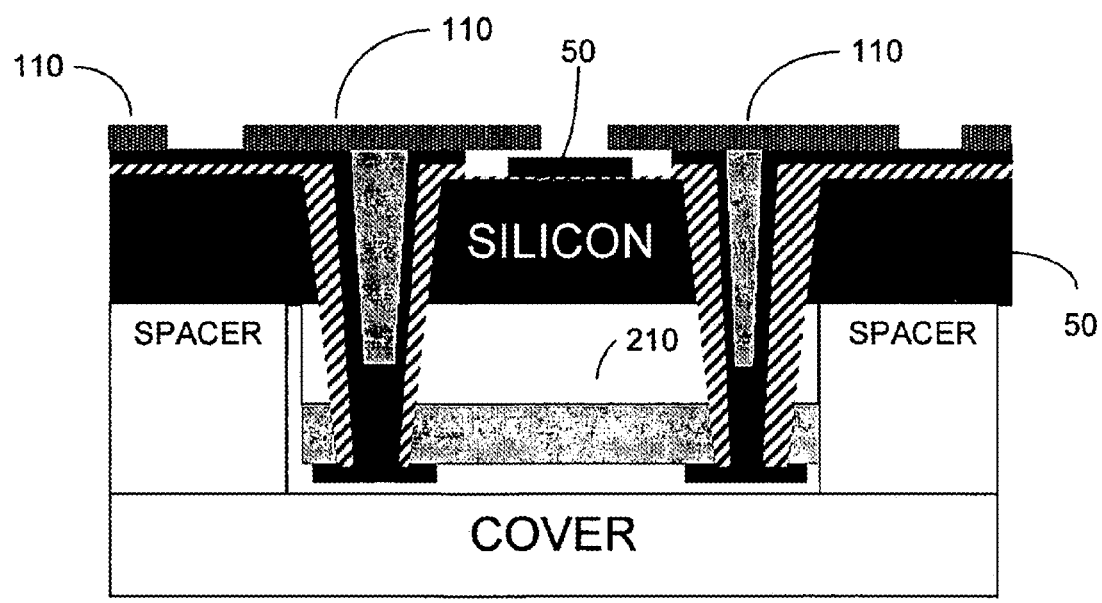

FIG. 25 illustrates a subsequent stage of production of vertical type LED package 200, wherein an electrically insulating second passivation layer 120 is applied to at least partially cover metal layer 100. In one embodiment electrically insulating second passivation layer 120 is comprised of solder mask and openings are provided for the electrical and thermal contacts. In one embodiment solder balls 130 are attached to metal layer 100 through openings in electrically insulating second passivation layer 120. In one embodiment solder balls 130 are used to conduct heat from e electronic package 10 to a PCB or other electrical board to which electronic package 10 is attached. In another embodiment, thermally conductive underfill material is used to conduct the heat.

In another embodiment, not illustrated, an additional metal heat conducting pad is deposited on electrically insulating first passivation layer 90 to provide a non-electrically conducting, heat conduction path.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein. The present materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

What is claimed is:

1. A method of forming an electronic device package, the method comprising:
providing an electronic device comprising a first contact point disposed in a first hole defined in the electronic device, the first hole extending from a face of the electronic device;
depositing a metal pad on said first contact point to provide direct electrical connection to said first contact point;
providing a substrate comprising a first face and a second face opposing the first face of said substrate;
attaching said provided electronic device to said provided substrate, such that the first face of said provided substrate is adjacent the face of said provided electronic device;
after attaching said provided electronic device to said provided substrate, etching a vertical interconnect access (VIA) from said second face of said substrate and terminating at and in direct physical contact with said metal pad with no intervening layers there between, said VIA aligned with and comprising the first hole in the electronic device, said VIA including a first sidewall and a second sidewall;
applying an electrically insulating first passivation layer to said second face of said substrate, said electrically insulating first passivation layer conforming to an exposed surface of said etched via;
etching a contact hole through said electrically insulating first passivation layer at an apex of said etched via to at least contact said deposited metal pad; and
depositing a metal layer on the electrically insulating first passivation layer said metal layer including a first portion that substantially conforms to a first exposed surface of said first sidewall, a second portion that substantially conforms to a second exposed surface of said second sidewall, a third portion in direct physical contact with said deposited metal pad and said first and second portions of the metal layer, a fourth portion disposed above the second face of the substrate and integrally connected to the first portion of the metal layer, and a fifth portion disposed above the second face of the substrate and integrally connected to the second portion of the metal layer, wherein said first and second portions of said metal layer define a second hole there between, and said first portion, said second portion, said third portion, said fourth portion, and said fifth portion of said metal layer comprise a continuous metal layer.

2. The method of claim 1, wherein said applied electrically insulating first passivation layer is constituted of a polymer.

3. The method of claim 1, further comprising applying a second passivation layer in said second hole to at least partially contact said deposited metal layer, said passivation layer substantially conforming to said first and second portions of said metal layer.

4. The method of claim 3, wherein said second passivation layer is constituted of solder mask material.

5. The method of claim 1, wherein said substrate is constituted of silicon.

6. The method of claim 1, wherein said drilling extends through said deposited metal pad.

7. The method of any of claim 1, wherein said electronic device is constituted of a light emitting diode.

8. The method according to claim 1, wherein said provided electronic device comprises a second contact point electrically different from said first contact point and said attached substrate is constituted of a conductive material, and the method further comprises depositing a second metal pad in contact with the second contact point.

9. The method according to claim 1, further comprising: providing a spacer element; and affixing said provided spacer element to said provided substrate, said spacer element defining a location for said attaching of said provided electronic device to said provided substrate.

10. The method according to claim 9, wherein said provided spacer element is constituted of a reflective polymer.

11. The method according to claim 1, further comprising: providing an optically transparent cover; and affixing said provided optically transparent cover such that said provided electronic device is disposed between said provided substrate and said provided optically transparent cover.

12. The method according to claim 11, wherein said provided optically transparent cover comprises at least one of: a lens; a diffusing element; a phosphor coating; a color changing material coating; an anti-reflective coating; and an optical filter.

13. The method according to claim 11, further comprising: providing a spacer element, wherein said provided spacer element defines a location for said affixing of said provided optically transparent cover.

14. The method according to claim 1, further comprising: depositing a second metal pad on a second contact point of said electronic device to provide direct electrical connection to said second contact point, wherein said second contact point disposed on the face of the electronic device.

15. The method according to claim 14, further comprising:
etching a second contact hole through a portion of said electrically insulating first passivation layer to partially expose said second face of said substrate;
depositing a sixth portion of said metal layer in said second contact hole, said sixth portion in direct physical contact with said partially-exposed second face of said substrate, wherein said first portion, said second portion, said third portion, said fourth portion, said fifth portion, and said sixth portion of said metal layer comprise a continuous metal layer; and
defining a metal gap in said fifth portion of said metal layer to electrically isolate said first, second, third, and fourth portions of said metal layer from said sixth portion of said metal layer, thereby electrically isolating said first contact from said second contact.

\* \* \* \* \*